(12) United States Patent
Steinbrecher et al.

(10) Patent No.: US 7,984,250 B2
(45) Date of Patent: Jul. 19, 2011

(54) DYNAMIC UPDATING OF THRESHOLDS IN ACCORDANCE WITH OPERATING CONDITONS

(75) Inventors: Robin Steinbrecher, Olympia, WA (US); Christian Le, North Plains, OR (US); Rahul Khanna, Portland, OR (US); Fernando A. Lopez, Hillsboro, OR (US); Kai Cheng, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 369 days.

(21) Appl. No.: 12/317,965

(22) Filed: Dec. 31, 2008

(65) Prior Publication Data

US 2010/0169585 A1 Jul. 1, 2010

(51) Int. Cl.
*G06F 12/00* (2006.01)
(52) U.S. Cl. ............... 711/154; 711/156; 711/E12.001
(58) Field of Classification Search .......... 711/154, 711/156, E12.001
See application file for complete search history.

(56) References Cited

U.S. PATENT DOCUMENTS

| | | | |
|---|---|---|---|
| 6,005,417 A | 12/1999 | Mehta et al. | |
| 6,364,761 B1 | 4/2002 | Steinbrecher | |
| 6,550,877 B1 | 4/2003 | Anderson et al. | |
| 6,658,345 B2 * | 12/2003 | Miller | 701/108 |
| 6,721,868 B1 | 4/2004 | Natu et al. | |
| 6,817,442 B2 | 11/2004 | Van Sleet et al. | |
| 6,937,473 B2 | 8/2005 | Cheng et al. | |
| 7,058,750 B1 | 6/2006 | Rankin et al. | |
| 7,234,029 B2 | 6/2007 | Khare et al. | |
| 7,269,481 B2 | 9/2007 | De Lorenzo et al. | |
| 7,343,442 B2 | 3/2008 | Rankin et al. | |
| 7,734,980 B2 | 6/2010 | Alexander et al. | |
| 2002/0141879 A1 | 10/2002 | Winkel et al. | |
| 2005/0168942 A1 | 8/2005 | Steinbrecher | |
| 2007/0006048 A1 | 1/2007 | Zimmer et al. | |
| 2008/0244291 A1 | 10/2008 | Alexander et al. | |
| 2008/0307082 A1 | 12/2008 | Cai et al. | |
| 2009/0006837 A1 | 1/2009 | Rothman et al. | |
| 2010/0169729 A1 | 7/2010 | Datta et al. | |

FOREIGN PATENT DOCUMENTS

| | | |
|---|---|---|
| KR | 10-2008-0017754 A | 2/2008 |
| WO | 2006/071195 A1 | 7/2006 |
| WO | 2007/098126 A2 | 8/2007 |
| WO | 2010/078178 A2 | 7/2010 |

OTHER PUBLICATIONS

International Search Report and Written Opinion received for PCT Patent Application No. PCT/US2009/069352, mailed on Aug. 20, 2010, 8 pages.

* cited by examiner

*Primary Examiner* — Pierre-Michel Bataille
(74) *Attorney, Agent, or Firm* — Paul E. Steiner (57) ABSTRACT

In some embodiments, a memory control device includes a sensor positioned remotely from a memory device, a register to store an offset value, the offset value corresponding to a difference between a temperature reading of the sensor and an estimated actual temperature of the memory device, and a controller to control an operation of the memory device, wherein the controller is configured to read the offset value from the register and control the operation of the memory device in accordance with the offset value. The controller may be configured to dynamically update the offset value during an operation of the memory device. Other embodiments are disclosed and claimed.

23 Claims, 6 Drawing Sheets

DYNAMIC UPDATING OF THRESHOLDS IN ACCORDANCE WITH OPERATING CONDITONS

The invention relates to thermal management. More particularly, some embodiments of the invention relate to dynamic updating of thermal thresholds in accordance with operating conditions.

BACKGROUND AND RELATED ART

Many electronic devices may include memory subsystems. At higher density or higher performance, thermal management of the memory subsystem may be beneficial.

BRIEF DESCRIPTION OF THE DRAWINGS

Various features of the invention will be apparent from the following description of preferred embodiments as illustrated in the accompanying drawings, in which like reference numerals generally refer to the same parts throughout the drawings. The drawings are not necessarily to scale, the emphasis instead being placed upon illustrating the principles of the invention.

DESCRIPTION

In the following description, for purposes of explanation and not limitation, specific details are set forth such as particular structures, architectures, interfaces, techniques, etc. in order to provide a thorough understanding of the various aspects of the invention. However, it will be apparent to those skilled in the art having the benefit of the present disclosure that the various aspects of the invention may be practiced in other examples that depart from these specific details. In certain instances, descriptions of well known devices, circuits, and methods are omitted so as not to obscure the description of the present invention with unnecessary detail.

Figure 1:
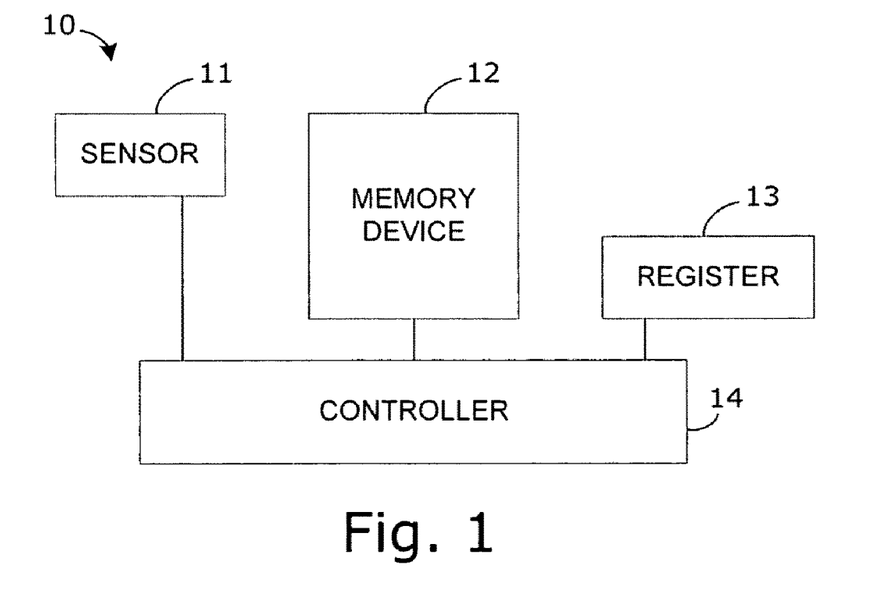
FIG. 1 is a block diagram of memory control device in accordance with some embodiments of the present invention.

With reference to FIG. 1, a memory control device 10 in accordance with some embodiments of the invention may include a sensor 11 positioned remotely from a memory device 12, a register 13 to store an offset value, and a controller 14 to control an operation of the memory device 12. For example, the offset value may correspond to a difference between a temperature reading of the sensor 11 and an estimated actual temperature of the memory device 12. For example, the controller 14 may be configured to read the offset value from the register 13 and control the operation of the memory device 12 in accordance with the offset value. For example, the controller 14 may be configured to dynamically update the offset value during an operation of the memory device 12.

In some embodiments of the invention, the estimated actual temperature of the memory device 12 may be dependent on an amount of cooling provided by a variable cooling device during operation, and the controller 14 may be configured to update the offset value in accordance with the amount of cooling provided by the variable cooling device. For example, in some embodiments of the invention the controller 14 may be further configured to dynamically update a threshold value associated with the memory device 12 in accordance with the amount of cooling provided by the variable cooling device. For example, the variable cooling device may include a multi-speed fan and the controller 14 may be configured to update the offset value in accordance with a speed of the multi-speed fan. Alternatively, the variable cooling device may include a liquid cooling system with a variable pump speed.

Figure 2:
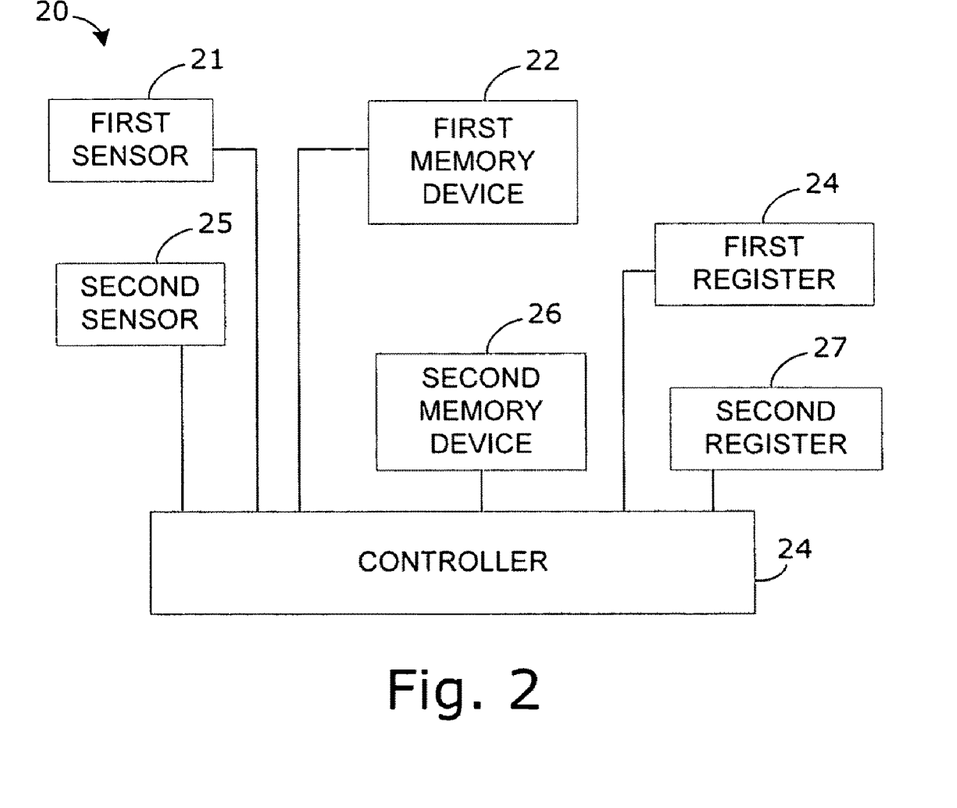
FIG. 2 is a block diagram of another memory control device in accordance with some embodiments of the invention.

With reference to FIG. 2, a memory control device 20 in accordance with some embodiments of the invention may include a first sensor 21 positioned remotely from a first memory device 22 and a first register 23 to store a first offset value. For example, the first offset value may correspond to a difference between a temperature reading of the first sensor 21 and an estimated actual temperature of the first memory device 22. The memory control device 20 may further include a second sensor 25 positioned remotely from a second memory device 26 and a second register 27 to store a second offset value. For example, the second offset value may correspond to a difference between a temperature reading of the second sensor 25 and an estimated actual temperature of the second memory device 26. The memory control device 20 may further include a controller 24 to control an operation of the first memory device 22 and the second memory device 26.

For example, the controller 24 may configured to read the first offset value from the first register 23 and control the operation of the first memory device 22 in accordance with the first offset value. For example, the controller 24 may be configured to dynamically update the first offset value during an operation of the first memory device 22. For example, the controller 24 may configured to read the second offset value from the second register 27 and control the operation of the first memory device 22 in accordance with the first offset value. For example, the controller 24 may be configured to dynamically update the second offset value during an operation of the second memory device 26.

For example, in some embodiments of the memory control device 20, the respective estimated actual temperatures of the first and second memory devices may be dependent on an amount of cooling provided by a variable cooling device during operation, and the controller may be configured to update the first and second offset values in accordance with the amount of cooling provided by the variable cooling device. In some embodiments, for example, the controller may be further configured to dynamically update a first threshold value associated with the first memory device and a second threshold value associated with the second memory device in accordance with the amount of cooling provided by the variable cooling device. For example, the variable cooling device may include a multi-speed fan and the controller 24 may be configured to update the first and second offset values in accordance with a speed of the multi-speed fan. For example, the first offset value may be different from the second offset value.

Figure 3:
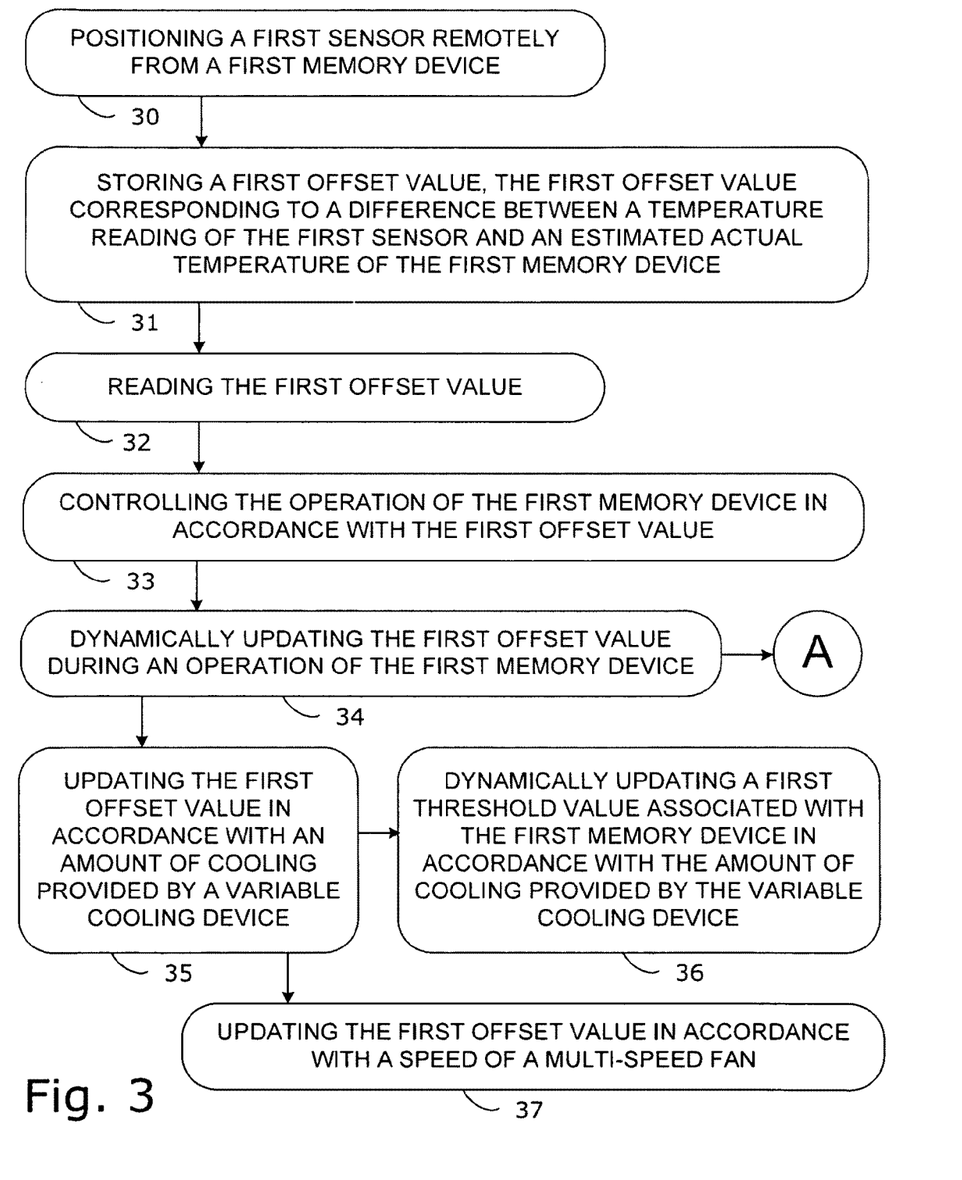
FIG. 3 is a flow diagram in accordance with some embodiments of the invention.

With reference to FIG. 3, some embodiments of the invention may include positioning a first sensor remotely from a first memory device (e.g. at block 30), storing a first offset value, the first offset value corresponding to a difference between a temperature reading of the first sensor and an estimated actual temperature of the first memory device (e.g. at block 31), reading the first offset value (e.g. at block 32), controlling the operation of the first memory device in accordance with the first offset value (e.g. at block 33), and dynamically updating the first offset value during an operation of the first memory device (e.g. at block 34).

For example, dynamically updating the first offset value during an operation of the first memory device may include updating the first offset value in accordance with an amount of cooling provided by a variable cooling device (e.g. at block 35). For example, some embodiments of the invention may further include dynamically updating a first threshold value associated with the first memory device in accordance with the amount of cooling provided by the variable cooling device (e.g. at block 36). For example, the variable cooling device may include a multi-speed fan and dynamically updating the first offset value during an operation of the first memory device may include updating the first offset value in accordance with a speed of the multi-speed fan (e.g. at block 37).

Figure 4:
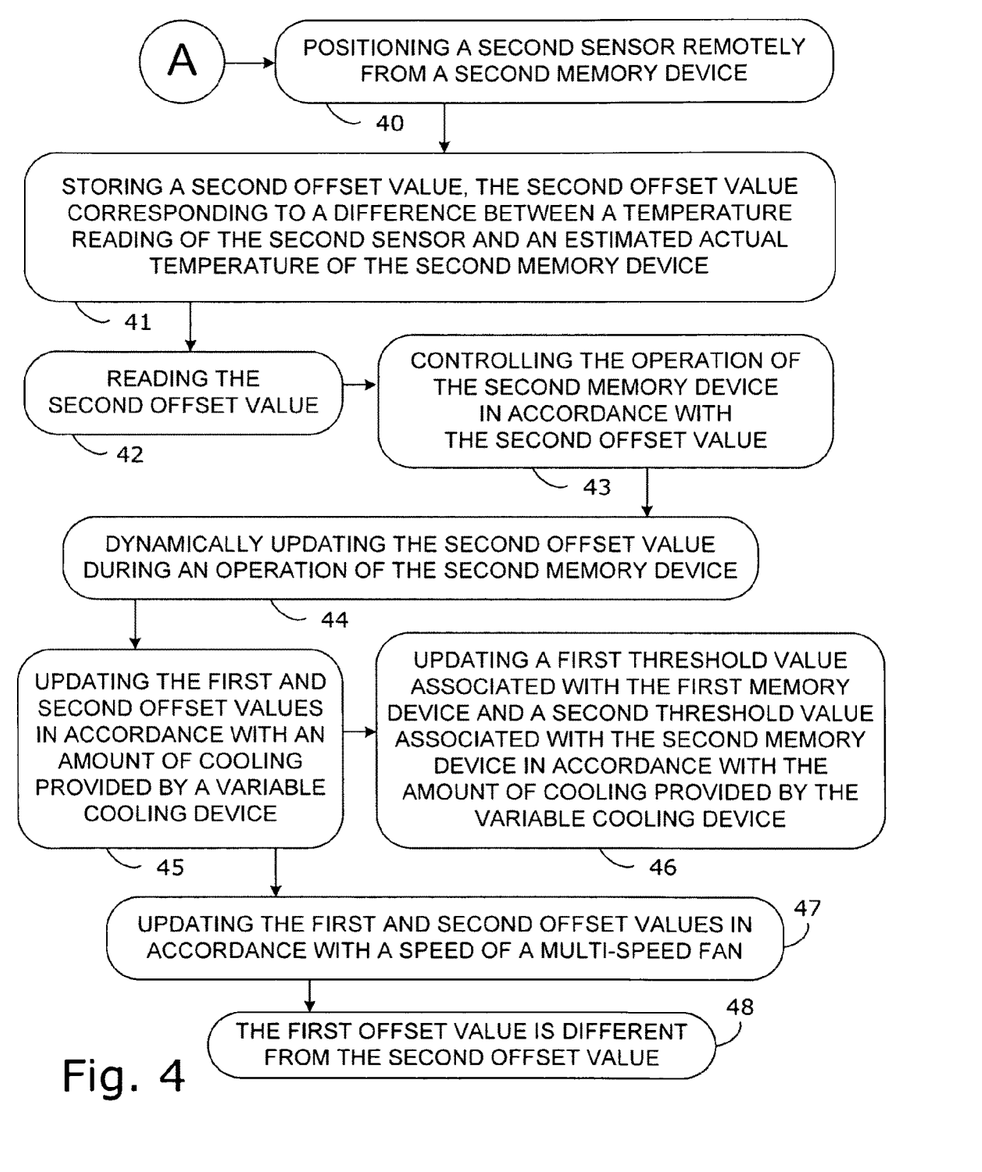
FIG. 4 is another flow diagram in accordance with some embodiments of the invention.

With reference to FIG. 4, some embodiments of the invention may further include positioning a second sensor remotely from a second memory device (e.g. at block 40), storing a second offset value, the second offset value corresponding to a difference between a temperature reading of the second sensor and an estimated actual temperature of the second memory device (e.g. at block 41), reading the second offset value (e.g. at block 42), controlling the operation of the second memory device in accordance with the second offset value (e.g. at block 43), and dynamically updating the second offset value during an operation of the second memory device (e.g. at block 44).

For example, dynamically updating the first and second offset values may include updating the first and second offset values in accordance with an amount of cooling provided by a variable cooling device (e.g. at block 45). For example, some embodiments may further include dynamically updating a first threshold value associated with the first memory device and a second threshold value associated with the second memory device in accordance with the amount of cooling provided by the variable cooling device (e.g. at block 46). For example, the variable cooling device may include a multi-speed fan and dynamically updating the first and second offset values may include updating the first and second offset values in accordance with a speed of the multi-speed fan (e.g. at block 47). For example, the first offset value may be different from the second offset value (e.g. at block 48). Alternatively, the variable cooling device may include a liquid cooling system with a variable pump speed.

Figure 5:
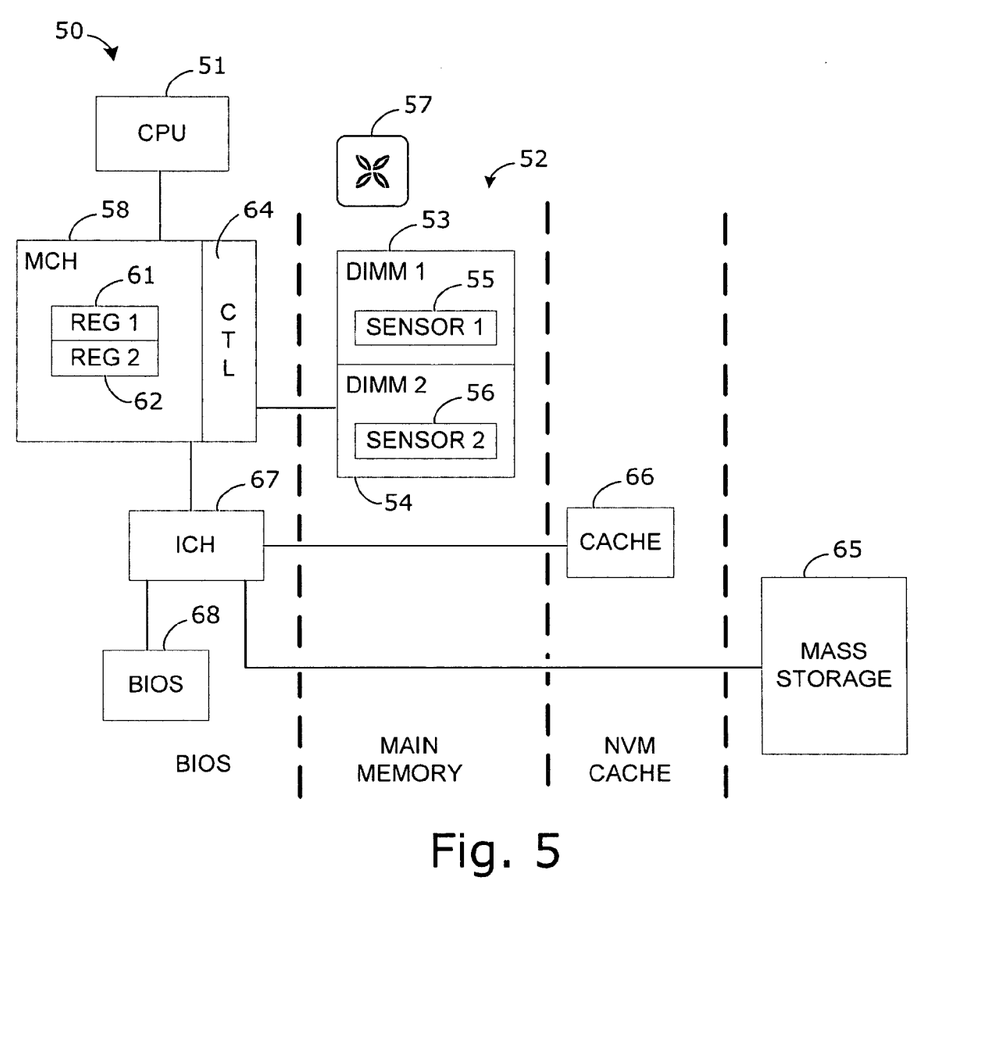
FIG. 5 is a block diagram of a processor-based electronic device in accordance with some embodiments of the invention.

With reference to FIG. 5, in accordance with some embodiments of the invention a processor-based electronic system 50 may include a processor 51 and a memory subsystem 52 coupled to the processor 51, the memory subsystem 52 including a first memory device 53 and a second memory device 54. The system 50 may further include a first sensor 55 positioned remotely from the first memory device 53 and a second sensor 56 positioned remotely from the second memory device 54. A variable cooling device 57 may be configured to provide cooling to the memory subsystem 52. A memory controller 58 may be coupled to the memory subsystem 52 and the variable cooling device 57.

For example, the memory controller 58 may include a first register 61 to store a first offset value, the first offset value corresponding to a difference between a temperature reading of the first sensor 55 and an estimated actual temperature of the first memory device 53, a second register 62 to store a second offset value, the second offset value corresponding to a difference between a temperature reading of the second sensor 56 and an estimated actual temperature of the second memory device 54, and a controller 64 to control an operation of the memory subsystem 52. For example, the controller 64 may be configured to read the first offset value from the first register 61 and control the operation of the first memory device 53 in accordance with the first offset value, read the second offset value from the second register 62 and control the operation of the second memory device 54 in accordance with the second offset value, dynamically update the first offset value during an operation of the first memory device 53, and dynamically update the second offset value during an operation of the second memory device 54.

In some embodiments of the processor-based electronic system 50, the respective estimated actual temperatures of the first memory and second memory devices 53, 54 may be dependent on an amount of cooling provided by the variable cooling device 57 during operation, and the controller 64 may be configured to update the first and second offset values in accordance with the amount of cooling provided by the variable cooling device 57. For example, in some embodiments of the system 50, the controller 64 may be further configured to dynamically update a first threshold value associated with the first memory device 53 and a second threshold value associated with the second memory device 54 in accordance with the amount of cooling provided by the variable cooling device 57. For example, the variable cooling device 57 may include a multi-speed fan and the controller 64 may be configured to update the first and second offset values in accordance with a speed of the multi-speed fan. For example, the first offset value may be different from the second offset value.

The processor-based system 50 may further a mass storage device 65, and a cache memory 66 located between the memory subsystem 52 and the mass storage device 65. For example, the processor 51 may be a central processing unit (CPU). For example, the cache memory 66 may be a non-volatile cache memory (NVM). For example, the memory subsystem 22 may be a main system memory providing dynamic random access memory (DRAM) in one or more DIMM modules. For example, the sensors 55 and 56 may be respectively disposed on the DIMM modules but spaced from the DRAM chips. For example, the memory controller 58 may be a memory controller hub (MCH). For example, the mass storage device 65 may be a rotating media such as a hard disk drive or an optical disk drive. For example, the mass storage device 65 may be a non-rotating media such as a solid-state drive. For example, both the cache 66 and the mass storage device 65 may be coupled to the MCH via an input/output controller hub (ICH) 67.

For example, the registers 61 and 62 may be resident on the MCH 58, the mass storage device 65, the system memory 52, or another memory or storage device coupled to the processor-based system 50. For example, the registers may be implemented as part of a basic input/output system (BIOS) 68 coupled to the ICH 67.

In accordance with some embodiments of the invention, the various features may be distributed through various components. For example, a memory DIMM device may have a Temperature Sensor on DIMM (TSOD). The TSOD may provide the thermal data of the DIMM. For example, there may be multiple DIMMs on the system but only one TSOD per DIMM. A memory controller may include the memory thermal offset registers. For example, these registers may be the thermal offset registers that may be manipulated or updated based on the fan rotational speed. For example, the DIMM temperature sensors may be polled via an SMBUS controller that is on the MCH. The system may further include a management agent. For example, the management agent may be part of a baseboard management controller that performs two primary functions. First, the management controller may control the system fan speed. Second, the management controller may receive information about the fan rotational speed and update the thermal offset registers that reside on the memory controller.

By way of example, a memory subsystem may be difficult to cool within a server chassis. Advantageously, some embodiments of the invention may increase memory performance prior to throttling for thermal control.

Figure 6:
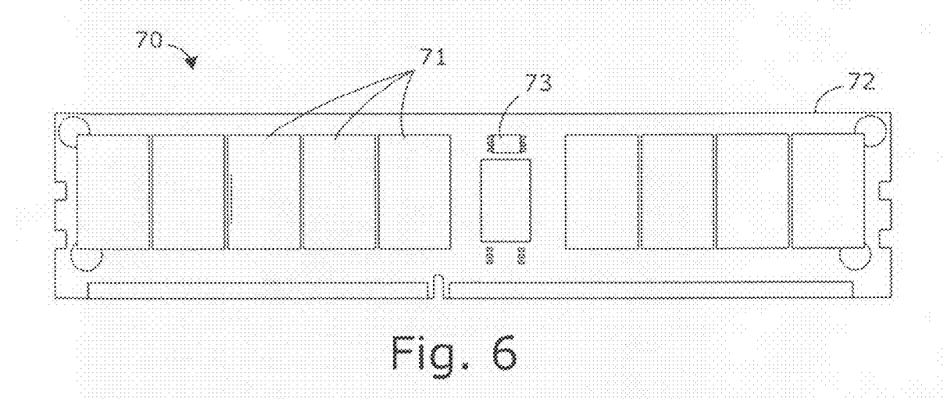
FIG. 6 is a block diagram of a memory module in accordance with some embodiments of the invention.

With reference to FIG. 6, a memory module 70 may include a double data rate (DDR) dual-inline memory module (DIMM) having a plurality of memory devices 71 on both sides of a printed circuit board 72. For example, the memory devices 71 may be direct random access memory (DRAM) integrated circuits. For example, the memory module 70 may include a DDR3 RDIMM. The memory module 70 may include a thermal sensor 73 mounted on the printed circuit board 72 remote from the memory devices 71. For example, the sensor 73 does not directly measure the temperature of the memory devices 71 but is in close enough proximity to provide a reasonable correlation between the temperature of the memory devices 71 and the temperature reading of the sensor 73. Advantageously, some embodiments of the invention may provide more accurate correlations between the temperature of the memory devices 71 and the temperature reading of the sensor 73 by storing different offset values in accordance with various operating conditions.

Advantageously, some embodiments of the invention may provide an offset register to store an offset value corresponding to a difference between the temperature measured by the sensor 73 and an estimated actual operating temperature of the memory devices 73. For example, the offset value may be calculated using thermal modeling software or may be determined empirically under actual operation of the system. Advantageously, some embodiments of the invention may provide store a plurality of offset values to update the DRAM-to-sensor offset based on system thermal conditions under a wide variety of operating loads and parameters.

For example, a variable cooling system may be used to provide cooling to the memory modules in a server system. A multi-speed fan is one example of a variable cooling system. A multi-speed fan may have a variety of discrete speed settings or may be continuously variable, among other possibilities for speed control of a multi-speed fan. In some systems, at low fan speeds the offset between the sensor and DRAMs may be high, therefore, a high offset value must be used to ensure that thermal limits are not exceeded. At the other extreme, when fan speeds are high, the static offset between the sensor and DRAMs may be lower and the guardband may be reduced or removed.

Figure 7:
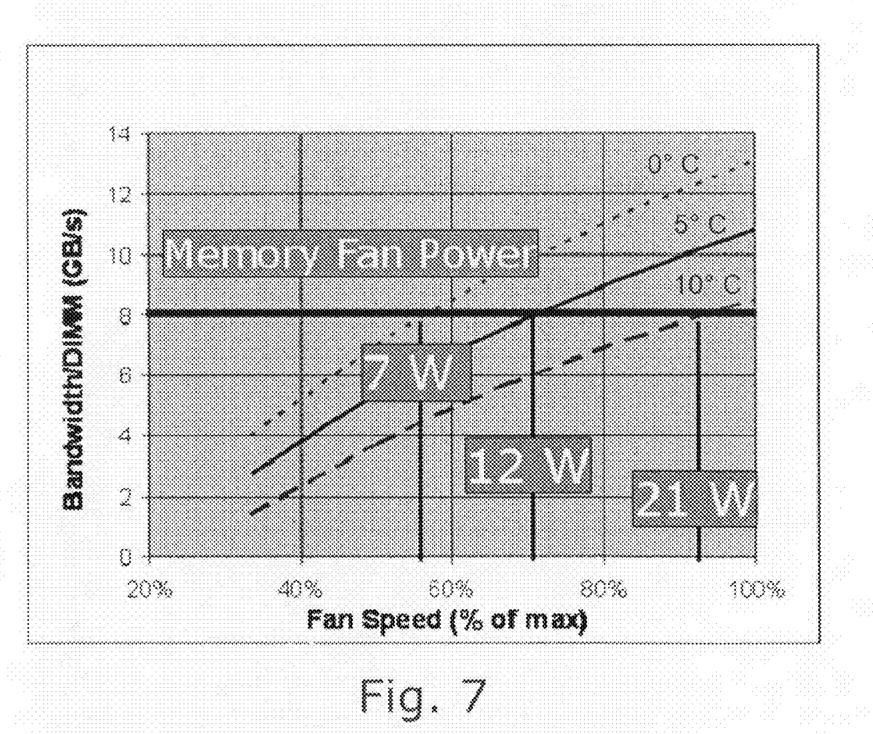
FIG. 7 is a chart of memory bandwidth versus fan speed comparing various embodiments of the invention.

For example, various power management schemes may change the fan speed during operation. With lower fan power, accurate sensing of component thermal conditions may be more critical. With reference to FIG. 7, a chart of fan speed versus memory bandwidth shows an example of reducing threshold guardband on fan power for memory cooling in a 1U system. The graph plots memory bandwidth vs. fan speed. Three cases are plotted and identified as 0° C., 5° C. and 10° C. For a given target bandwidth of 8 GB/s as represented by the horizontal line a different fan speed may be required depending upon the temperature guardband. For example, if the sensor was perfect as represented by the 0° C. curve the fan power consumption at 8 GB/s would be 7 watts. Increasing the guardband as shown by the 5° C. and 10° C. curves results in higher fan power for that same 8 GB/s of 12 watts and 21 watts, respectively. From the foregoing, it may be concluded that a computer system may potentially save significant fan power while providing the same performance by adjusting the offset based upon system cooling conditions.

In a conventional system, the throttling of access to the DRAMs may be performed under an assumed worst case temperature scenario, thereby limiting memory performance under many less than extreme operating conditions. Advantageously in accordance with some embodiments of the invention, with prior thermal characterization of the system, DRAM-to-sensor offset values may be selected based on fan speed and to the memory controller may update the offset values during operation in accordance with the fan speed to provide improved memory bandwidth under a wider variety of operating conditions.

For example, an offset register may be available for each DIMM in the system and each could be independently rewritten based on its thermal characteristics. For example, in a conventional mixed DIMM environment, the DIMM with the worst thermal performance may cause throttling of all the DIMMs or an increased fan speed. Advantageously, some embodiments of the invention may control the guardband on each DIMM individually, thereby improving overall performance.

Figure 8:
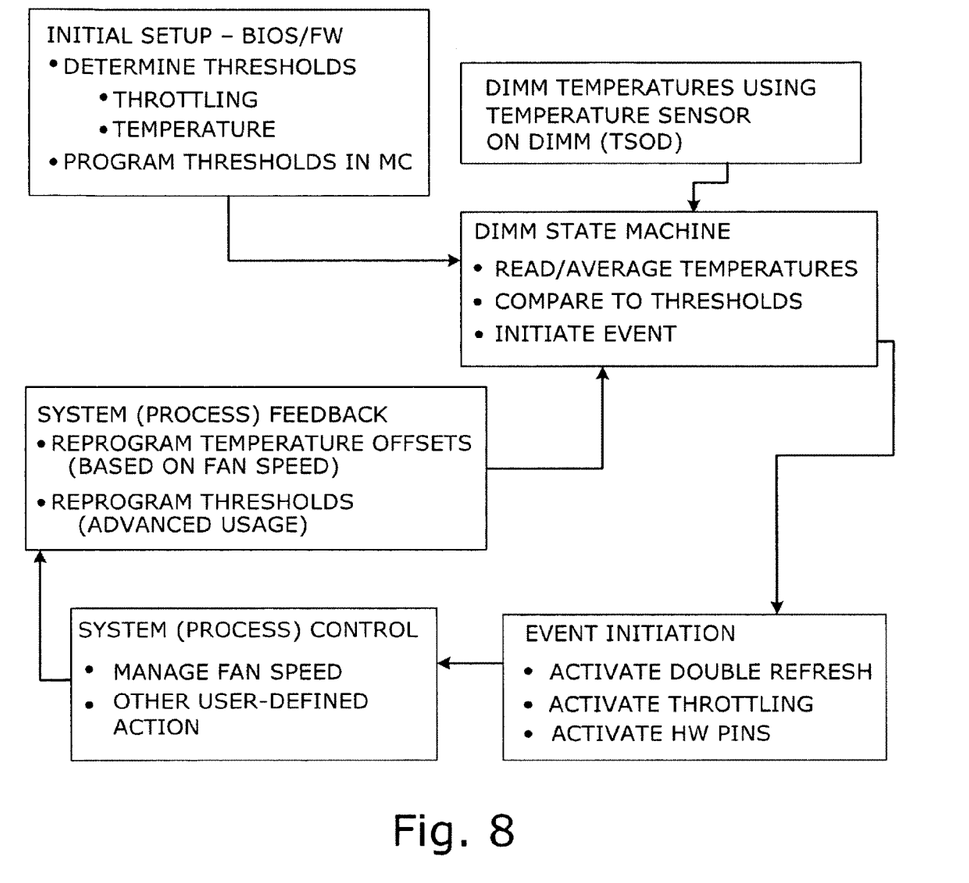
FIG. 8 is a state diagram in accordance with some embodiments of the invention.

With reference to FIG. 8, some embodiments of the invention involve and initial setup of the BIOS and/or firmware. For example, various thresholds may be determined (e.g. throttling and temperature) under various operating conditions. The thresholds and offsets may then be programmed in the memory controller. During operation, the DIMM temperatures may be read using a Temperature Sensor on DIMM (TSOD). A DIMM state machine may compare the temperature reading to the thresholds programmed in the memory controller (e.g. using the present state of offset values) and initiate an event as may be appropriate in accordance with the comparison.

For example, an event initiation may include activating double refresh, activating throttling, and/or activating hardware pins, etc., among other possibilities for initiated events. A memory or management controller may manage the fan speed and/or perform other user defined actions in accordance with the initiated event(s). Based on an updated operating environment, the memory controller may reprogram the temperature offsets (e.g. based on fan speed) and/or other thresholds. Advantageously, some embodiments of the invention may utilize dynamic updating to improve memory access performance before throttling engages and/or to delay fan speed (and power) increases to increase the likelihood that throttling does not occur.

Those skilled in the art will appreciate that the flow diagram of FIGS. 3-4 and the state diagram of FIG. 8 may be implemented in any of a number of arrangements of hardware, software, and/or firmware. For example, the flow diagram may be completely implemented by special purpose hardware circuits. Alternatively, the flow diagram may be completely implemented by software running on a general purpose processor. Alternatively, the flow diagram may be selectively partitioned between special purpose hardware and software running on a general purpose processor.

The foregoing and other aspects of the invention are achieved individually and in combination. The invention should not be construed as requiring two or more of such aspects unless expressly required by a particular claim. Moreover, while the invention has been described in connection with what is presently considered to be the preferred examples, it is to be understood that the invention is not limited to the disclosed examples, but on the contrary, is intended to cover various modifications and equivalent arrangements included within the spirit and the scope of the invention.

What is claimed is:

1. A method of controlling a memory, comprising:
    positioning a first sensor remotely from a first memory device;
    storing a first offset value, the first offset value corresponding to a difference between a temperature reading of the first sensor and an estimated actual temperature of the first memory device;
    reading the first offset value;
    controlling the operation of the first memory device in accordance with the first offset value; and
    dynamically updating the first offset value during an operation of the first memory device.

2. The method of claim 1, wherein dynamically updating the first offset value during an operation of the first memory device comprises:
    updating the first offset value in accordance with an amount of cooling provided by a variable cooling device.

3. The method of claim 2, further comprising:
    dynamically updating a first threshold value associated with the first memory device in accordance with the amount of cooling provided by the variable cooling device.

4. The method of claim 2, wherein the variable cooling device comprises a multi-speed fan and wherein dynamically updating the first offset value during an operation of the first memory device comprises:
    updating the first offset value in accordance with a speed of the multi-speed fan.

5. The method of claim 1, further comprising:
    positioning a second sensor remotely from a second memory device;
    storing a second offset value, the second offset value corresponding to a difference between a temperature reading of the second sensor and an estimated actual temperature of the second memory device;
    reading the second offset value;
    controlling the operation of the second memory device in accordance with the second offset value; and
    dynamically updating the second offset value during an operation of the second memory device.

6. The method of claim 5, wherein dynamically updating the first and second offset values comprises:
    updating the first and second offset values in accordance with an amount of cooling provided by a variable cooling device.

7. The method of claim 6, further comprising:
    dynamically updating a first threshold value associated with the first memory device and a second threshold value associated with the second memory device in accordance with the amount of cooling provided by the variable cooling device.

8. The method of claim 6, wherein the variable cooling device comprises a multi-speed fan and wherein dynamically updating the first and second offset values comprises:
    updating the first and second offset values in accordance with a speed of the multi-speed fan.

9. The method of claim 8, wherein the first offset value is different from the second offset value.

10. A memory control device, comprising:
    a first sensor positioned remotely from a first memory device;
    a first register to store a first offset value, the first offset value corresponding to a difference between a temperature reading of the first sensor and an estimated actual temperature of the first memory device; and
    a controller to control an operation of the first memory device, wherein the controller is configured to read the first offset value from the first register and control the operation of the first memory device in accordance with the first offset value,
    and wherein the controller is configured to dynamically update the first offset value during an operation of the first memory device.

11. The memory control device of claim 10, wherein the estimated actual temperature of the first memory device is dependent on an amount of cooling provided by a variable cooling device during operation, and wherein the controller is configured to update the first offset value in accordance with the amount of cooling provided by the variable cooling device.

12. The memory control device of claim 11, wherein the controller is further configured to dynamically update a first threshold value associated with the first memory device in accordance with the amount of cooling provided by the variable cooling device.

13. The memory control device of claim 11, wherein the variable cooling device comprises a multi-speed fan and wherein the controller is configured to update the first offset value in accordance with a speed of the multi-speed fan.

14. The memory control device of claim 10, further comprising:
    a second sensor positioned remotely from a second memory device; and
    a second register to store a second offset value, the second offset value corresponding to a difference between a temperature reading of the second sensor and an estimated actual temperature of the second memory device,
    wherein the controller is configured to read the second offset value from the second register and control the operation of the second memory device in accordance with the second offset value,
    and wherein the controller is configured to dynamically update the second offset value during an operation of the second memory device.

15. The memory control device of claim 14, wherein the respective estimated actual temperatures of the first and second memory devices are dependent on an amount of cooling provided by a variable cooling device during operation, and wherein the controller is configured to update the first and second offset values in accordance with the amount of cooling provided by the variable cooling device.

16. The memory control device of claim 15, wherein the controller is further configured to dynamically update a first threshold value associated with the first memory device and a second threshold value associated with the second memory device in accordance with the amount of cooling provided by the variable cooling device.

17. The memory control device of claim 15, wherein the variable cooling device comprises a multi-speed fan and wherein the controller is configured to update the first and second offset values in accordance with a speed of the multi-speed fan.

18. The memory control device of claim 17, wherein the first offset value is different from the second offset value.

19. A processor-based electronic system, comprising:
    a processor;

a memory subsystem coupled to the processor, the memory subsystem including a first memory device and a second memory device;
a first sensor positioned remotely from the first memory device;
a second sensor positioned remotely from the second memory device;
a variable cooling device configured to provide cooling to the memory subsystem; and
a memory controller coupled to the memory subsystem and the variable cooling device, wherein the memory controller comprises:
 a first register to store a first offset value, the first offset value corresponding to a difference between a temperature reading of the first sensor and an estimated actual temperature of the first memory device; and
 a second register to store a second offset value, the second offset value corresponding to a difference between a temperature reading of the second sensor and an estimated actual temperature of the second memory device; and
 a controller to control an operation of the memory subsystem, wherein the controller is configured to:
  read the first offset value from the first register and control the operation of the first memory device in accordance with the first offset value;
  read the second offset value from the second register and control the operation of the second memory device in accordance with the second offset value;
  dynamically update the first offset value during an operation of the first memory device; and
  dynamically update the second offset value during an operation of the second memory device.

20. The processor-based electronic system of claim 19, wherein the respective estimated actual temperatures of the first memory and second memory devices are dependent on an amount of cooling provided by the variable cooling device during operation, and wherein the controller is configured to update the first and second offset values in accordance with the amount of cooling provided by the variable cooling device.

21. The processor-based electronic system of claim 20, wherein the controller is further configured to dynamically update a first threshold value associated with the first memory device and a second threshold value associated with the second memory device in accordance with the amount of cooling provided by the variable cooling device.

22. The processor-based electronic system of claim 20, wherein the variable cooling device comprises a multi-speed fan and wherein the controller is configured to update the first and second offset values in accordance with a speed of the multi-speed fan.

23. The processor-based electronic system of claim 22, wherein the first offset value is different from the second offset value.

* * * * *